United States Patent
Duan et al.

(10) Patent No.: US 9,034,199 B2
(45) Date of Patent: May 19, 2015

(54) CERAMIC ARTICLE WITH REDUCED SURFACE DEFECT DENSITY AND PROCESS FOR PRODUCING A CERAMIC ARTICLE

(71) Applicant: Applied Materials, Inc., Santa Clara, CA (US)

(72) Inventors: Ren-Guan Duan, Fremont, CA (US); Thorsten Lill, Santa Clara, CA (US); Jennifer Y. Sun, Mountain View, CA (US); Benjamin Schwarz, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/659,813

(22) Filed: Oct. 24, 2012

(65) Prior Publication Data

US 2013/0216783 A1    Aug. 22, 2013

Related U.S. Application Data

(60) Provisional application No. 61/601,458, filed on Feb. 21, 2012.

(51) Int. Cl.
*B44C 1/22* (2006.01)
*C04B 41/00* (2006.01)
(Continued)

(52) U.S. Cl.
CPC ..... *C04B 41/0072* (2013.01); *Y10T 428/24372* (2015.01); *Y10T 428/24355* (2015.01);
(Continued)

(58) Field of Classification Search
CPC ............ H01L 21/67069; H01L 21/3065; C04B 41/0072; C04B 2235/3225; C04B 35/505; C04B 2235/662; C04B 2235/96; C04B 2235/3224; H01J 37/32495; C03B 2201/36; C03C 2201/3411; C03C 2201/36
See application file for complete search history.

(56) References Cited

U.S. PATENT DOCUMENTS

| 3,796,182 A | 3/1974 | Rosler |
| 4,399,199 A | 8/1983 | McGill |

(Continued)

FOREIGN PATENT DOCUMENTS

| DE | 03/01654 | 6/2003 |
| EP | 0330196 B1 | 8/1989 |

(Continued)

OTHER PUBLICATIONS

Ulrike Taffner et al., "Preparation and Microstructural Analysis of High-Performance Ceramics," ASM Handbook vol. 9: Metallography and Microstructures, 2004, 11 pages, ASM International, Materials Park, Ohio, USA.

(Continued)

*Primary Examiner* — Lan Vinh
*Assistant Examiner* — Jiong-Ping Lu
(74) *Attorney, Agent, or Firm* — Lowenstein Sandler LLP

(57) ABSTRACT

A machined ceramic article having an initial surface defect density and an initial surface roughness is provided. The machined ceramic article is heated to a temperature range between about 1000° C. and about 1800° C. at a ramping rate of about 0.1° C. per minute to about 20° C. per minute. The machined ceramic article is heat-treated in air atmosphere. The machined ceramic article is heat treated at one or more temperatures within the temperature range for a duration of up to about 24 hours. The machined ceramic article is then cooled at the ramping rate, wherein after the heat treatment the machined ceramic article has a reduced surface defect density and a reduced surface roughness.

20 Claims, 12 Drawing Sheets

(51) Int. Cl.

| | |
|---|---|
| *H01L 21/67* | (2006.01) |
| *C04B 35/111* | (2006.01) |
| *C04B 35/14* | (2006.01) |
| *C04B 35/44* | (2006.01) |
| *C04B 35/46* | (2006.01) |
| *C04B 35/486* | (2006.01) |
| *C04B 35/505* | (2006.01) |
| *C04B 35/56* | (2006.01) |
| *C04B 35/565* | (2006.01) |
| *C04B 35/58* | (2006.01) |
| *C04B 35/581* | (2006.01) |
| *C04B 35/584* | (2006.01) |
| *C04B 41/80* | (2006.01) |

(52) U.S. Cl.
CPC ........ *H01L21/67069* (2013.01); *C04B 35/111* (2013.01); *C04B 35/14* (2013.01); *C04B 35/44* (2013.01); *C04B 35/46* (2013.01); *C04B 35/486* (2013.01); *C04B 35/505* (2013.01); *C04B 35/5611* (2013.01); *C04B 35/5622* (2013.01); *C04B 35/565* (2013.01); *C04B 35/58014* (2013.01); *C04B 35/581* (2013.01); *C04B 35/584* (2013.01); *C04B 2235/3225* (2013.01); *C04B 2235/6562* (2013.01); *C04B 2235/6567* (2013.01); *C04B 2235/658* (2013.01); *C04B 2235/6581* (2013.01); *C04B 2235/662* (2013.01); *C04B 2235/76* (2013.01); *C04B 2235/764* (2013.01); *C04B 2235/785* (2013.01); *C04B 2235/963* (2013.01); *C04B 41/009* (2013.01); *C04B 41/80* (2013.01)

(56) References Cited

U.S. PATENT DOCUMENTS

| | | | |
|---|---|---|---|
| 4,439,248 A | 3/1984 | Herchenroeder et al. | |
| 4,642,440 A | 2/1987 | Schnackel et al. | |
| 4,704,299 A | 11/1987 | Wielonski et al. | |
| 4,880,614 A | 11/1989 | Strangman et al. | |
| 5,381,944 A | 1/1995 | Makowiecki et al. | |
| 5,415,756 A | 5/1995 | Wolfe et al. | |
| 5,626,923 A | 5/1997 | Fitzgibbons et al. | |
| 5,631,803 A | 5/1997 | Cameron et al. | |
| 5,687,679 A | 11/1997 | Mullin et al. | |
| 5,800,871 A | 9/1998 | Collins et al. | |
| 5,837,058 A | 11/1998 | Chen et al. | |
| 5,853,815 A | 12/1998 | Muehlberger | |
| 5,916,689 A | 6/1999 | Collins et al. | |
| 6,106,959 A | 8/2000 | Vance et al. | |
| 6,194,083 B1 | 2/2001 | Yasuda et al. | |
| 6,245,202 B1 | 6/2001 | Edamura et al. | |
| 6,361,645 B1 | 3/2002 | Schoepp et al. | |
| 6,506,254 B1* | 1/2003 | Bosch et al. | 118/715 |
| 6,530,990 B2 | 3/2003 | Kong et al. | |
| 6,534,194 B2 | 3/2003 | Weihs et al. | |
| 6,581,275 B2 | 6/2003 | Narendrnath et al. | |
| 6,616,031 B2 | 9/2003 | Wong et al. | |
| 6,783,875 B2 | 8/2004 | Yamada et al. | |
| 6,794,059 B2 | 9/2004 | Shanker | |
| 6,805,952 B2 | 10/2004 | Chang et al. | |
| 6,933,254 B2 | 8/2005 | Morita et al. | |
| 6,942,929 B2 | 9/2005 | Han et al. | |
| 7,300,537 B2 | 11/2007 | O'Donnell et al. | |
| 7,351,482 B2 | 4/2008 | Boutwell et al. | |
| 7,441,688 B2 | 10/2008 | Van Heerden et al. | |
| 7,507,268 B2 | 3/2009 | Rosenflanz | |
| 7,510,641 B2 | 3/2009 | Kreiskott et al. | |
| 7,615,133 B2 | 11/2009 | Tateno et al. | |
| 7,648,782 B2 | 1/2010 | Kobayashi et al. | |
| 7,649,729 B2 | 1/2010 | Buchberger, Jr. et al. | |
| 7,690,308 B2 | 4/2010 | Nielson et al. | |
| 7,696,117 B2 | 4/2010 | Sun et al. | |
| 7,810,704 B2 | 10/2010 | Duckham et al. | |
| 7,964,517 B2 | 6/2011 | Jaiswal | |
| 8,034,734 B2 | 10/2011 | Sun et al. | |
| 8,206,829 B2 | 6/2012 | Sun et al. | |
| 8,367,227 B2 | 2/2013 | Sun et al. | |
| 8,404,572 B2 | 3/2013 | Chang et al. | |
| 2001/0003271 A1 | 6/2001 | Otsuki | |
| 2002/0018921 A1* | 2/2002 | Yamada et al. | 428/697 |
| 2002/0086119 A1 | 7/2002 | Hariharan et al. | |
| 2002/0100424 A1 | 8/2002 | Sun et al. | |
| 2003/0007308 A1 | 1/2003 | Harada et al. | |
| 2003/0047802 A1 | 3/2003 | Hiramatsu et al. | |
| 2003/0159657 A1* | 8/2003 | Kaushal et al. | 118/723 R |
| 2003/0185965 A1 | 10/2003 | Lin et al. | |
| 2003/0232139 A1 | 12/2003 | DeTura | |
| 2004/0009297 A1 | 1/2004 | Fusaro, Jr. et al. | |
| 2004/0033385 A1 | 2/2004 | Kaushal et al. | |
| 2004/0110016 A1* | 6/2004 | Hamaya et al. | 428/472 |
| 2004/0266216 A1 | 12/2004 | Li et al. | |
| 2005/0037193 A1 | 2/2005 | Sun et al. | |
| 2005/0042876 A1 | 2/2005 | Kobayashi et al. | |
| 2005/0056056 A1 | 3/2005 | Wong | |
| 2005/0084654 A1 | 4/2005 | Takahashi et al. | |
| 2005/0266682 A1 | 12/2005 | Chen et al. | |
| 2006/0068189 A1 | 3/2006 | Raybould et al. | |
| 2006/0096703 A1* | 5/2006 | Moriya et al. | 156/345.19 |
| 2006/0164785 A1 | 7/2006 | Pellegrin | |
| 2007/0006561 A1 | 1/2007 | Brady et al. | |
| 2007/0110915 A1 | 5/2007 | Kitamura et al. | |
| 2007/0169891 A1 | 7/2007 | Koshiishi et al. | |
| 2007/0212567 A1 | 9/2007 | Esaki et al. | |
| 2007/0218302 A1 | 9/2007 | Kobayashi et al. | |
| 2008/0016684 A1 | 1/2008 | Olechnowicz et al. | |
| 2008/0029032 A1 | 2/2008 | Sun et al. | |
| 2008/0090034 A1 | 4/2008 | Harrison et al. | |
| 2008/0099148 A1* | 5/2008 | Ryabova et al. | 156/345.48 |
| 2008/0108225 A1 | 5/2008 | Sun et al. | |
| 2008/0169588 A1 | 7/2008 | Shih et al. | |
| 2008/0174930 A1 | 7/2008 | Hattori et al. | |
| 2008/0213496 A1 | 9/2008 | Sun et al. | |
| 2008/0223725 A1 | 9/2008 | Han et al. | |
| 2008/0241412 A1 | 10/2008 | Inaki et al. | |
| 2008/0264564 A1 | 10/2008 | Sun et al. | |
| 2008/0264565 A1 | 10/2008 | Sun et al. | |
| 2008/0268645 A1 | 10/2008 | Kao et al. | |
| 2009/0034147 A1 | 2/2009 | Narendrnath et al. | |
| 2009/0034148 A1 | 2/2009 | Lubomirsky et al. | |
| 2009/0034149 A1 | 2/2009 | Lubomirsky et al. | |
| 2009/0036292 A1 | 2/2009 | Sun et al. | |
| 2009/0075486 A1 | 3/2009 | Kikuyama et al. | |
| 2009/0133713 A1 | 5/2009 | Ohmi et al. | |
| 2009/0214825 A1 | 8/2009 | Sun et al. | |
| 2009/0284894 A1 | 11/2009 | Cooke | |
| 2009/0297718 A1 | 12/2009 | Sarrafi-Nour et al. | |
| 2010/0053841 A1 | 3/2010 | Rusinko, Jr. et al. | |
| 2010/0112192 A1 | 5/2010 | Li et al. | |
| 2010/0119843 A1 | 5/2010 | Sun et al. | |
| 2010/0160143 A1 | 6/2010 | Sun et al. | |
| 2010/0177454 A1 | 7/2010 | Elliot et al. | |
| 2010/0218472 A1 | 9/2010 | Iyer | |
| 2010/0272982 A1 | 10/2010 | Dickinson et al. | |
| 2010/0314356 A1* | 12/2010 | Nagayama et al. | 216/52 |
| 2011/0049729 A1 | 3/2011 | Naundorf et al. | |
| 2011/0086178 A1 | 4/2011 | Ruud et al. | |
| 2011/0149462 A1 | 6/2011 | Kugimoto et al. | |
| 2011/0151237 A1 | 6/2011 | Nakano et al. | |
| 2011/0174441 A1 | 7/2011 | Yamashita et al. | |
| 2011/0198034 A1 | 8/2011 | Sun et al. | |
| 2011/0268877 A1 | 11/2011 | Dickson et al. | |
| 2011/0268956 A1 | 11/2011 | Altuna et al. | |
| 2011/0315081 A1 | 12/2011 | Law et al. | |
| 2012/0034469 A1 | 2/2012 | Sun et al. | |
| 2012/0040100 A1 | 2/2012 | Matias et al. | |
| 2012/0076574 A1 | 3/2012 | Parke | |
| 2012/0100299 A1 | 4/2012 | Zajchowski et al. | |
| 2012/0100300 A1 | 4/2012 | Gindrat et al. | |
| 2012/0104703 A1 | 5/2012 | Sun et al. | |
| 2012/0125488 A1 | 5/2012 | Sun et al. | |
| 2012/0299253 A1 | 11/2012 | Kosakai et al. | |

(56) References Cited

U.S. PATENT DOCUMENTS

| | | |
|---|---|---|
| 2012/0307412 A1 | 12/2012 | Boyd, Jr. et al. |
| 2013/0019797 A1 | 1/2013 | Tanaka et al. |
| 2013/0026720 A1 | 1/2013 | Hori et al. |
| 2013/0174983 A1 | 7/2013 | Kikuchi et al. |
| 2013/0216783 A1 | 8/2013 | Sun et al. |
| 2013/0216821 A1 | 8/2013 | Sun et al. |
| 2013/0224675 A1 | 8/2013 | Park |
| 2013/0273313 A1 | 10/2013 | Sun et al. |
| 2013/0273327 A1 | 10/2013 | Sun et al. |
| 2013/0284373 A1 | 10/2013 | Sun et al. |
| 2013/0288037 A1 | 10/2013 | Sun et al. |
| 2014/0030486 A1 | 1/2014 | Sun et al. |
| 2014/0030533 A1 | 1/2014 | Sun et al. |

FOREIGN PATENT DOCUMENTS

| | | |
|---|---|---|
| JP | 2002/087878 | 3/2002 |
| JP | 2005-279481 | 10/2005 |
| JP | 2010/106327 | 5/2010 |
| JP | 2010-229492 | 10/2010 |
| KR | 10-2003-0025007 | 3/2003 |
| KR | 10-2007-0013118 | 1/2007 |
| KR | 10-2011-0028378 | 3/2011 |
| KR | 10-2011-0117845 | 10/2011 |
| WO | WO 01/24581 | 4/2001 |
| WO | WO 02/00968 | 1/2002 |
| WO | WO 2003/100843 | 12/2003 |
| WO | WO 2013/126466 | 8/2013 |
| WO | WO 2013/155220 | 10/2013 |
| WO | WO 2013/162909 | 10/2013 |
| WO | WO 2014/018830 | 1/2014 |
| WO | WO 2014/018835 | 1/2014 |

OTHER PUBLICATIONS

Tania Bhatia et al., "Mechanisms of ceramic coating deposition in solution-precurosr plasma spray," J.Mater. Res., vol. 17, No. 9, Sep. 2002, 10 pages, Materials Research Society, Warrendale, PA, USA.

Hass et al., "Gas jet assisted vapor deposition of yttria stabilized zircona," Department of Materials Science and Engineering, School of Engineering and Applied Science, University of Virginia, Charlottesville, Virginia, 22903, published Feb. 27, 2009.

Di Girolamo et al., "Microstructure and thermal properties of plasma-sprayed ceramic thermal barrier coatings," Energia, Ambiente e Innovazione, Published Jan. 2, 2013.

Bergant et al., "Porosity evaluation of flame-sprayed and heat-treated coatings using image analysis," Image Anal Stereo 2011;30:53-62, Published Jan. 27, 2011.

Smith, et al., "Very Low Pressure Plasma Spray—A Review of an Emerging Technology in the Thermal Spray Community," Coatings 2011, 1, 117-132; doi:10.3390/coatings1020117, Published Dec. 20, 2011.

International Search Report & Written Opinion of the International Searching Authority dated Apr. 25, 2013, in International Application No. PCT/US2013/026963.

Govidarajan et al., "In situ Particle Generation and Splat Formation During Solution Precursor Plasma Spraying of Yttria-Stabilized Zirconia Coatings," J Am. Ceram. Soc., 1-9 (2011).

"Thermal Spraying," definition, Wikipedia, http://en.wikipedia.org/wiki/Thermal_spraying, downloaded Apr. 14, 2014.

Kitamura et al., "Structural, Mechanical and Erosion Properties of Yttrium Oxide Coatings by Axial Suspension Plasma Spraying for Electronics Applications," Journal of Thermal Spray Technology, 20:170-185, Jan. 2011.

* cited by examiner

US 9,034,199 B2

CERAMIC ARTICLE WITH REDUCED SURFACE DEFECT DENSITY AND PROCESS FOR PRODUCING A CERAMIC ARTICLE

TECHNICAL FIELD

This patent application claims the benefit under 35 U.S.C. §119(e) of U.S. Provisional Application No. 61/601,458, filed Feb. 21, 2012.

TECHNICAL FIELD

Embodiments of the present invention relate, in general, to a heat treatment process that minimizes surface defect density and ceramic articles processed using a heat treatment process.

BACKGROUND

In the semiconductor industry, devices are fabricated by a number of manufacturing processes producing structures of an ever-decreasing size. Some manufacturing processes such as plasma etch and plasma clean processes expose a substrate to a high-speed stream of plasma to etch or clean the substrate. The plasma may be highly corrosive, and may corrode processing chambers and other surfaces that are exposed to the plasma. This corrosion may generate particles, which frequently contaminate the substrate that is being processed, contributing to device defects.

As device geometries shrink, susceptibility to defects increases, and particle contaminant requirements become more stringent. Accordingly, as device geometries shrink, allowable levels of particle contamination may be reduced. To minimize particle contamination introduced by plasma etch and/or plasma clean processes, chamber materials have been developed that are resistant to plasmas. Examples of such plasma resistant materials include ceramics composed to $Al_2O_3$, AlN, SiC and $Y_2O_3$. However, the plasma resistance properties of these ceramic materials may be insufficient for some applications. For example, plasma resistant ceramic lids and/or nozzles that are manufactured using traditional ceramic manufacturing processes may produce unacceptable levels of particle contamination when used in plasma etch processes of semiconductor devices with critical dimensions of 45nm or 32 nm.

SUMMARY

In one embodiment, a ceramic article having an initial surface defect density and an initial surface roughness is provided. The ceramic article is heated to a temperature range between about 1000° C. and about 1800° C. at a ramping rate of about 0.1° C. per minute to about 20° C. per minute. The ceramic article is heat treated at one or more temperatures within the temperature range for a duration of up to about 24 hours. The ceramic article is then cooled at the ramping rate. After the heat treatment, the ceramic article has a reduced surface defect density and a reduced surface roughness, and may additionally have a greater resistance to plasma.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1A:
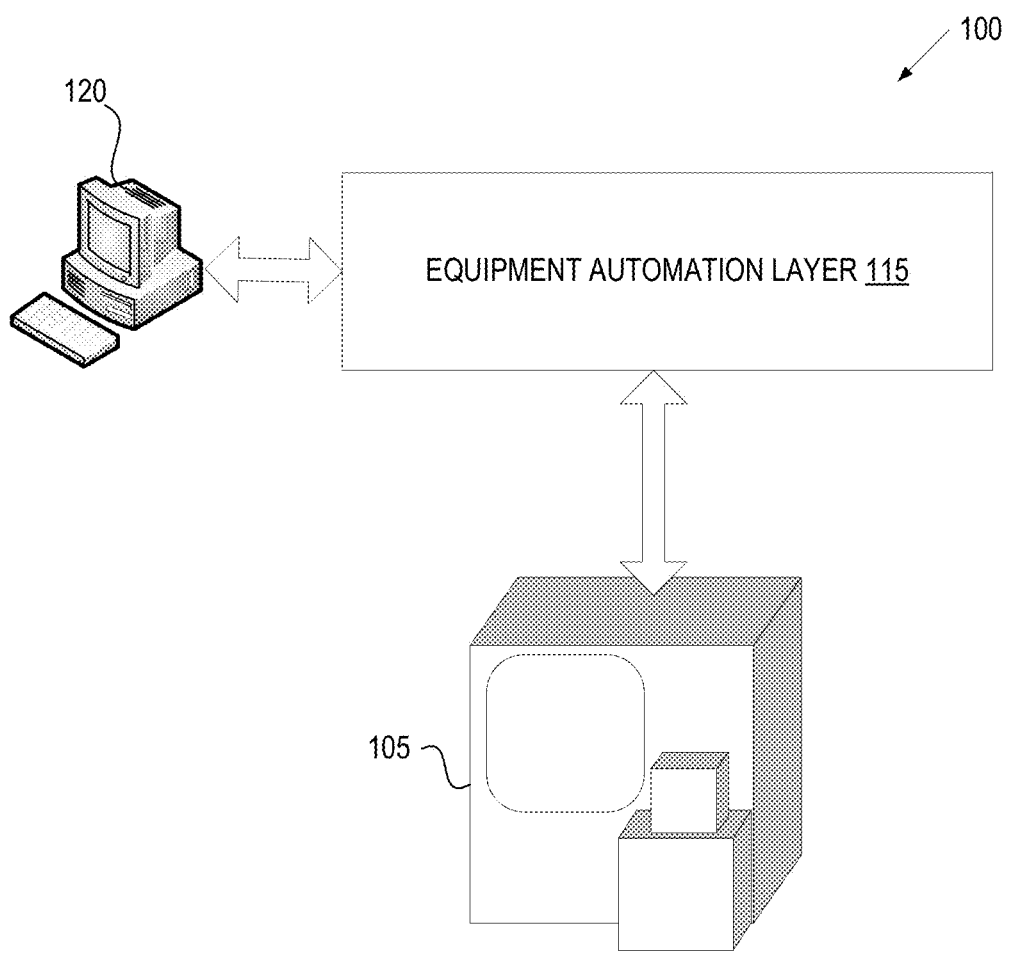
FIG. 1A illustrates an exemplary architecture of a manufacturing system, in accordance with one embodiment of the present invention.

Embodiments of the invention are directed to a process for heat treating a ceramic article, and to a ceramic article processed using the heat treatment. In one embodiment, a ceramic article having an initial surface defect density and an initial surface roughness is provided. The ceramic article may be a hot pressed or sintered ceramic article that has been machined (e.g., that has been polished, ground, had holes drilled in it, etc.). The ceramic article may also be a hot pressed or sintered ceramic article that has not been machined. The ceramic article may be, for example, a ceramic lid or nozzle for a plasma etcher (also known as a plasma etch reactor). The ceramic article is heated to a temperature range between about 1000° C. and about 1800° C. at a ramping rate of about 0.1° C. per minute to about 20° C. per minute. The ceramic article is heat treated at one or more temperatures within the temperature range for a duration of up to about 24 hours. The ceramic article is then cooled at the ramping rate. After the heat treatment, the ceramic article has a reduced surface defect density and a reduced surface roughness, and may additionally have a greater resistance to plasma. Moreover, dimensions of the ceramic article may experience little to no change as a result of the heat treatment.

In one embodiment, a furnace performs a heat treatment process on a ceramic article having an initial surface defect and an initial surface roughness. The furnace heats the ceramic article at a ramping rate of about 0.1° C. per minute to about 20° C. per minute until the ceramic article reaches a specified temperature or temperature range. The specified temperature range may vary from about 1000° C. to about 1800° C., and the specified temperature may be a temperature within the specified temperature range. The furnace heat treats the ceramic article at the specified temperature and/or other specified temperatures within the temperature range for a duration of up to about 24 hours. The furnace then cools the ceramic article at the ramping rate. After the heat treatment, the ceramic article has a reduced surface defect density and a reduced surface roughness, and may additionally have a greater resistance to plasma.

Embodiments of the invention reduce the surface roughness and surface defect density of processed ceramic articles, and minimize surface particles on the ceramic articles. Such heat treated ceramic articles have a reduced number of high energy bonds (broken bonds), and may produce a significantly lower amount of particle contamination when used in semiconductor processes that apply plasmas (e.g., plasma etch and plasma clean processes). For example, ceramic lids and nozzles for etcher machines may be heat treated to minimize particle contamination introduced during plasma etch processes. Thus, semiconductors manufactured using the heat treated ceramic articles described herein may have a lower defect count and may result in reduced scrap rates.

The term "heat treating" is used herein to mean applying an elevated temperature to a ceramic article, such as by a furnace. The term "machined ceramic article" refers to a ceramic article that has been surface ground, polished, drilled, abraded, cut, or otherwise processed with machine tools. When the terms "about" and "approximate" are used herein, this is intended to mean that the nominal value presented is precise within ±10%.

Some embodiments are described herein with reference to using a furnace to perform a heat treatment. However, it should be understood that other heat treatment techniques may also be used to perform the described heat treatment. Some examples of additional heat treatment techniques that may be used include a laser surface treatment (also referred to as laser heat treatment), an electron beam (e-beam) surface treatment (also referred to as e-beam heat treatment), a flame surface treatment (also referred to as a flame heat treatment), and a high temperature plasma treatment.

Note also that some embodiments are described herein with reference to ceramic lids and ceramic nozzles used in plasma etchers for semiconductor manufacturing. However, it should be understood that such plasma etchers may also be used to manufacture micro-electro-mechanical systems (MEMS)) devices. Additionally, the heat treated ceramic articles described herein may be other structures that are exposed to plasma. For example, the ceramic articles may be rings, walls, bases, gas distribution plates, shower heads, substrate holding frames, etc. of a plasma etcher, a plasma cleaner, a plasma propulsion system, and so forth. Moreover, embodiments are described herein with reference to ceramic articles that cause reduced particle contamination when used in a process chamber for plasma rich processes. However, it should be understood that the ceramic articles discussed herein may also provide reduced particle contamination when used in process chambers for other processes such as plasma enhanced chemical vapor deposition (PECVD), plasma enhanced physical vapor deposition (PEPVD), plasma enhanced atomic layer deposition (PEALD), and so forth, and non-plasma etchers, non-plasma cleaners, chemical vapor deposition (CVD) furnaces, physical vapor deposition (PVD) furnaces, and so forth.

FIG. 1A illustrates an exemplary architecture of a manufacturing system, in accordance with one embodiment of the present invention. The manufacturing system 100 may be a ceramics manufacturing system. In one embodiment, the manufacturing system 100 includes a furnace 105 (e.g., a ceramic furnace such as a kiln), an equipment automation layer 115 and a computing device 120. In alternative embodiments, the manufacturing system 100 may include more or fewer components. For example, the manufacturing system 100 may include only the furnace 105, which may be a manual off-line machine.

Furnace 105 is a machine designed to heat articles such as ceramic articles. Furnace 105 includes a thermally insulated chamber, or oven, capable of applying a controlled temperature on articles (e.g., ceramic articles) inserted therein. In one embodiment, the chamber is hermitically sealed. Furnace 105 may include a pump to pump air out of the chamber, and thus to create a vacuum within the chamber. Furnace 105 may additionally or alternatively include a gas inlet to pump gasses (e.g., inert gasses such as Ar or $N_2$) into the chamber.

Furnace 105 may be a manual furnace having a temperature controller that is manually set by a technician during processing of ceramic articles. Furnace 105 may also be an off-line machine that can be programmed with a process recipe. The process recipe may control ramp up rates, ramp down rates, process times, temperatures, pressure, gas flows, and so on. Alternatively, furnace 105 may be an on-line automated furnace that can receive process recipes from computing devices 120 such as personal computers, server machines, etc. via an equipment automation layer 115. The equipment automation layer 115 may interconnect the furnace 105 with computing devices 120, with other manufacturing machines, with metrology tools and/or other devices.

The equipment automation layer 115 may include a network (e.g., a location area network (LAN)), routers, gateways, servers, data stores, and so on. Furnace 105 may connect to the equipment automation layer 115 via a SEMI Equipment Communications Standard/Generic Equipment Model (SECS/GEM) interface, via an Ethernet interface, and/or via other interfaces. In one embodiment, the equipment automation layer 115 enables process data (e.g., data collected by furnace 105 during a process run) to be stored in a data store (not shown). In an alternative embodiment, the computing device 120 connects directly to the furnace 105.

In one embodiment, furnace 105 includes a programmable controller that can load, store and execute process recipes. The programmable controller may control temperature settings, gas and/or vacuum settings, time settings, etc. of heat treat processes. The programmable controller may control a chamber heat up, may enable temperature to be ramped down as well as ramped up, may enable multi-step heat treating to be input as a single process, and so forth. The programmable controller may include a main memory (e.g., read-only memory (ROM), flash memory, dynamic random access memory (DRAM), static random access memory (SRAM), etc.), and/or a secondary memory (e.g., a data storage device such as a disk drive). The main memory and/or secondary memory may store instructions for performing heat treatment processes described herein.

The programmable controller may also include a processing device coupled to the main memory and/or secondary memory (e.g., via a bus) to execute the instructions. The processing device may be a general-purpose processing device such as a microprocessor, central processing unit, or the like. The processing device may also be a special-purpose processing device such as an application specific integrated circuit (ASIC), a field programmable gate array (FPGA), a digital signal processor (DSP), network processor, or the like. In one embodiment, programmable controller is a programmable logic controller (PLC).

In one embodiment, furnace 105 is programmed to execute a recipe that will cause the furnace 105 to heat treat a machined ceramic article using a heat treatment process described with reference to FIG. 1B.

Figure 1B:
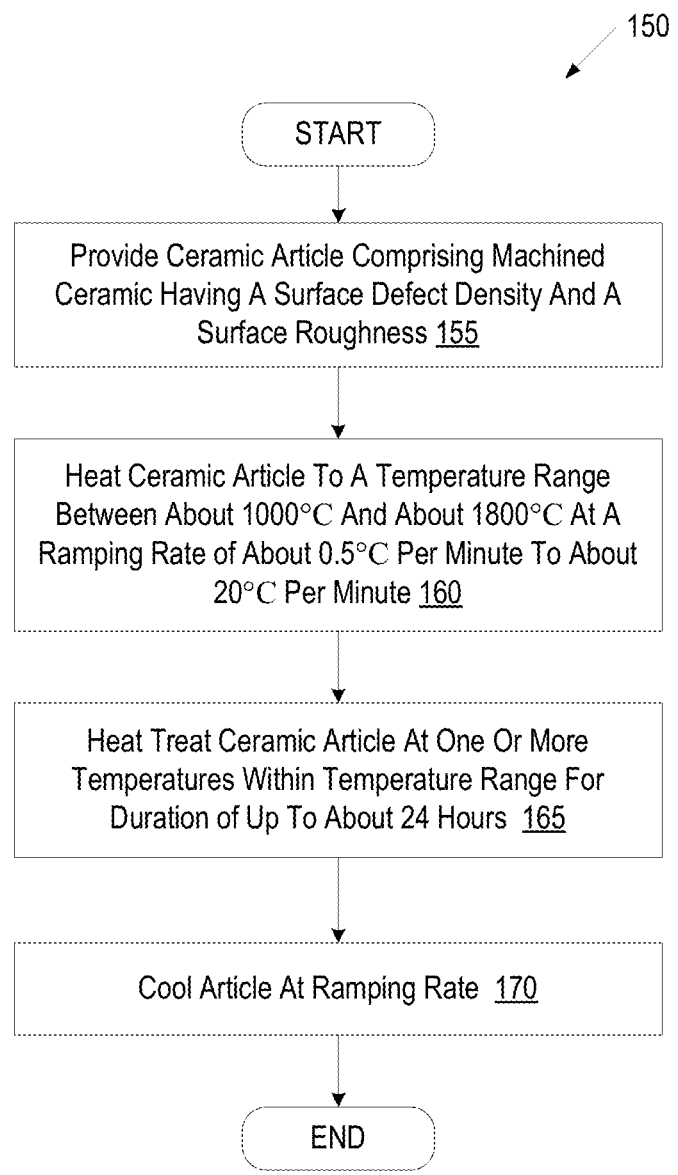
FIG. 1B illustrates a process for heat treating a ceramic article, in accordance with one embodiment of the present invention.

FIG. 1B is a flow chart showing a process 150 for heat treating a ceramic article, in accordance with one embodiment of the present invention. At block 155 of process 150, a machined ceramic article is provided (e.g., to a furnace or kiln). In one embodiment, the ceramic article is automatically loaded into a furnace by a loader. The ceramic article may be formed from a bulk ceramic such as $Y_2O_3$ (yttria or yttrium oxide), $Y_4Al_2O_9$ (YAM), $Al_2O_3$ (alumina) $Y_3Al_5O_{12}$ (YAG), YAlO3 (YAP), Quartz, SiC (silicon carbide) $Si_3N_4$ (silicon nitride) Sialon, AlN (aluminum nitride), AlON (aluminum oxynitride), $TiO_2$ (titania), $ZrO_2$ (zirconia), TiC (titanium carbide), ZrC (zirconium carbide), TiN (titanium nitride), TiCN (titanium carbon nitride) $Y_2O_3$ stabilized $ZrO_2$ (YSZ), and so on. The ceramic article may also be a ceramic composite such as $Y_3Al_5O_{12}$ distributed in $Al_2O_3$ matrix, $Y_2O_3$—$ZrO_2$ solid solution or a SiC—$Si_3N_4$ solid solution. The ceramic article may also be a ceramic composite that includes a yttrium oxide (also known as yttria and $Y_2O_3$) containing solid solution. For example, the ceramic article may be a high performance material (HPM) that is composed of a compound $Y_4Al_2O_9$ (YAM) and a solid solution $Y_2$-$xZr_xO_3$ ($Y_2O_3$—$ZrO_2$ solid solution). Note that pure yttrium oxide as well as yttrium oxide containing solid solutions may be doped with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides.

The ceramic article may be a sintered ceramic article that was produced from a ceramic powder or a mixture of ceramic powders. For example, the HPM ceramic composite may be produced from a mixture of a $Y_2O_3$ powder, a $ZrO_2$ powder and an $Al_2O_3$ powder. In one embodiment, the HPM ceramic composite contains 77% $Y_2O_3$, 15% $ZrO_2$ and 8% $Al_2O_3$. In another embodiment, the HPM ceramic composite contains 63% $Y_2O_3$, 23% $ZrO_2$ and 14% $Al_2O_3$. In still another embodiment, the HPM ceramic composite contains 55% $Y_2O_3$, 20% $ZrO_2$ and 25% $Al_2O_3$. Relative percentages may be in molar ratios. For example, the HPM ceramic composite may contain 77 mol % $Y_2O_3$, 15 mol % $ZrO_2$ and 8 mol % $Al_2O_3$. Other distributions of these ceramic powders may also be used for the HPM material.

If a mixture of ceramic powders was used to create the ceramic article, these powders may have been combined into a granular powder by spray drying. The granular powder may have subsequently been compacted by unidirectional mechanical pressing or cold isostatic pressing prior to performing a hot pressing or sintering process. The sintering process typically changes the size of the ceramic article by an uncontrolled amount. Due at least in part to this change in size, the ceramic article is typically machined after the sintering process is completed. The machining may include surface grinding and/or polishing the ceramic article, drilling holes in the ceramic article, cutting and/or shaping the ceramic article, and so forth.

The ceramic article is machined into a configuration that is appropriate for a particular application. Prior to machining, the ceramic article may have a rough shape and size appropriate for a particular purpose (e.g., to be used as a lid in a plasma etcher). However, the machining may be performed to precisely control size, shape, dimensions, hole sizes, and so forth of the ceramic article.

In one embodiment, the ceramic article is machined into a ceramic lid or a ceramic nozzle for a plasma etcher. The ceramic lid and ceramic nozzle in one embodiment are yttria dominant ceramics. Yttria dominant ceramics may be used due to the superior plasma resistance properties. In one embodiment, the ceramic nozzle is pure yttria ($Y_3O_2$), and the ceramic lid is the HPM ceramic composite. The HPM ceramic composite may have improved flexural strength over pure $Y_2O_3$. Since the ceramic lid has a large surface area, the HPM ceramic composite may be used for the ceramic lid to prevent cracking or buckling during processing (e.g., when a vacuum is applied to a process chamber of the plasma etcher). In an alternative embodiment, the ceramic lid and the ceramic nozzle are composed of the same ceramic substance. For example, both the ceramic lid and the ceramic nozzle may be formed of the HPM ceramic composite.

The sintering process may result in the ceramic article having a certain roughness, surface defect density and/or quantity of trapped particles. The surface roughness and/or surface defect density may be made worse by the machining process. Moreover, the machining process can generate a large number of surface particles that adhere to the ceramic article.

For ceramic articles that are components of a semiconductor processing device (e.g., an etcher) that will be used for a plasma process, the increased surface roughness, surface defect density and/or surface particles may cause particle contamination to processed substrates. For example, surface defects in the ceramic article may include broken (or open) bonds that are high energy locations. These surface defects may trap particles. For example, the particles may form weak broken bonds with the ceramic article at the surface defect. During a plasma treatment, the plasma may break these weak broken bonds, and remove some of the particles from the ceramic article. The ceramic particles may then be deposited on a processed substrate. Moreover, the plasma may break bonds of the ceramic article at the defect sites, which may erode the ceramic article and cause additional particles to be created.

At block 160, the ceramic article is heated at a ramping rate of about 0.1° C. to about 20° C. per minute. Ceramic articles may be fragile, and may crack when exposed to extreme changes in temperature. Accordingly, a ramping rate that is slow enough to prevent the ceramic article from cracking is used. It is expected that for some ceramics a ramping rate of more than 20° C. per minute may be possible. Accordingly, in some embodiments, ramping rates beyond 20° C. per minute that do not cause cracking may be used.

The temperature changes that cause a ceramic article to crack may depend on the composition of the ceramic article. For example, $Al_2O_3$ may be heated at a rate of 10° C. per minute or more without cracking. However, $Y_2O_3$ may crack if heated at a ramping rate that is faster than about 5° C. per minute. In one embodiment, a ramping rate of about 0.1-5° C. per minute is used for $Y_2O_3$ and for the HPM ceramic composite. In a further embodiment, a ramping rate of about 1° C. per minute is used for $Y_2O_3$ and for the HPM ceramic composite. Typically, the ceramic article will start at or near ambient temperature, and will slowly be heated at the ramping rate to a predetermined temperature.

The ceramic article is heated until it reaches a specified temperature or temperature range. The specified temperature may range from about 1000° C. to about 1800° C. The specific temperature used may depend on the composition of the ceramic article. In one embodiment, a temperature of 1600-1700° C. is used for the HPM ceramic composite and for yttria ($Y_2O_3$).

At block 165, the ceramic article is heat treated at the specified temperature or at one or more temperatures within the temperature range for a duration of up to 24 hours. The specific duration used may depend on a composition of the ceramic article, as well as desired performance properties of the ceramic article. For example, an increased heat treatment duration may cause the ceramic article to produce fewer particle contaminants than a shorter heat treatment duration. In one embodiment, the heat treatment duration is about 3-6 hours for yttria and for the HPM ceramic composite. In one embodiment, the heat treatment duration is about 4 hours for yttria and for the HPM ceramic composite.

In one embodiment, the ceramic article is maintained at a single temperature for the duration of the heat treatment. Alternatively, the ceramic article may be heated and/or cooled to multiple different temperatures within the temperature range during the heat treatment. For example, the ceramic article may be heat treated at a temperature of 1500° C. for 4 hours, may then be heat treated to a temperature of 1700° C. for another 2 hours, and may then be heat treated at 1000° C. for another three hours. Note that when multiple different heat treatment temperatures are used, the ceramic article may be heated and/or cooled at the ramping rate to transition between heat treatment temperatures.

As discussed above, the ceramic article may have a high number of surface defects and particles that are trapped by these surface defects. The heat treatment may reduce or eliminate these defects and/or particles. Specifically, the heat treatment may cause the particles to melt and/or may cause a portion of the ceramic article to melt at the surface defect regions. The melted particles may flow together with the ceramic article at the surface defect regions. The melted particles may then redeposit onto the ceramic article and form unbroken bonds with the ceramic article at these surface defect regions. The resultant unbroken bonds are much stronger than the broken bonds that previously bound the particles to the ceramic article. Thus, the particles become much less susceptible to being removed from the ceramic article during a plasma etch process, and the defect regions become less susceptible to erosion.

At block 170, the ceramic article is cooled at the ramping rate. In one embodiment, the ceramic article is cooled at the same ramping rate as the ramping rate used to heat the ceramic article. In another embodiment, a different ramping rate is used to cool the ceramic article than was used to heat the ceramic article. The resultant heat treated ceramic article may have improved performance with regards to both particle contamination of processed substrates and with regards to plasma erosion resistance. Thus, ceramic lids, ceramic nozzles and other ceramic internal process chamber components may be heat treated using process 150 to improve yield of manufactured products. Moreover, ceramic articles to which process 150 is applied may have a reduced replacement frequency, and may reduce apparatus down time.

Note that process 150 may be performed as part of a manufacturing process after ceramic articles have been machined. Additionally, process 150 may be periodically performed on used ceramic articles to heal or repair those ceramic articles. For example, a ceramic article may be heat treated using process 150 before use, and may then be heat treated using process 150 every few months, once a year, twice a year, or at some other frequency. The frequency with which to perform process 150 may depend on plasma etch and/or plasma clean recipes that are used with the ceramic article. For example, if the ceramic article is frequently exposed to particularly harsh plasma environments, then the ceramic article may be heat treated at an increased frequency.

Exposure to plasma may cause the ceramic article to erode and/or corrode over time. For example, the plasma may cause broken bonds to occur at the surface of the ceramic article, may generate ceramic particles that can contaminate processed substrates, may cause defects at the surface of the ceramic article, and so on. Accordingly, as a ceramic article ages, the more particle contamination it is likely to cause. The heat treatment process 150 may be performed on such aged ceramic articles to reverse damage caused by the corrosive plasma environment. The heat treatment may heal defects and reduce particles for used ceramic articles in addition to newly manufactured ceramic articles. Accordingly, process 150 may be performed on used ceramic articles to prolong their useful life.

Note that in addition to healing surface defects and minimizing particles, the heat treatment process 150 may also be used to dry clean ceramic articles. Exposure to plasma environments may cause polymers to form on a surface of the ceramic article. These polymers may cause particle contamination on substrates during subsequent processing. Often, a periodic wet clean procedure is performed to remove the polymers from the ceramic article. In one embodiment, heat treatment process 150 is performed instead of or in addition to a wet clean process. The heat treatment process 150 may cause the polymers that coat the ceramic article to react with air or another gas in a high temperature environment. This reaction may cause the polymer to become gaseous, and to leave the surface of the ceramic article. Therefore, the heat treatment process 150 can be used both to clean the ceramic article and to repair a surface of the ceramic article.

Figure 2A:
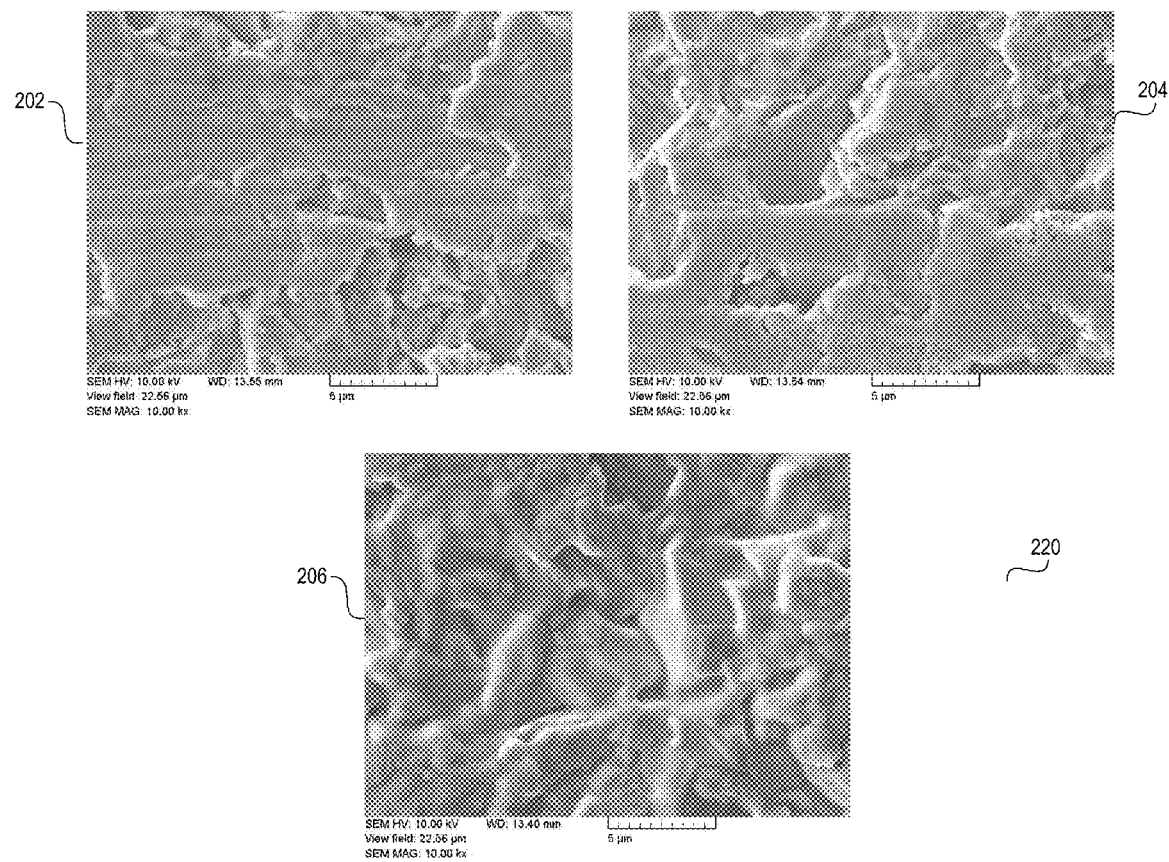
FIG. 2A shows micrographs of a ceramic article at a 10,000-fold magnification before the ceramic article is processed using a heat treatment, and after the ceramic article has been processed using heat treatments of various temperatures, in accordance with embodiments of the present invention.
Figure 2A:
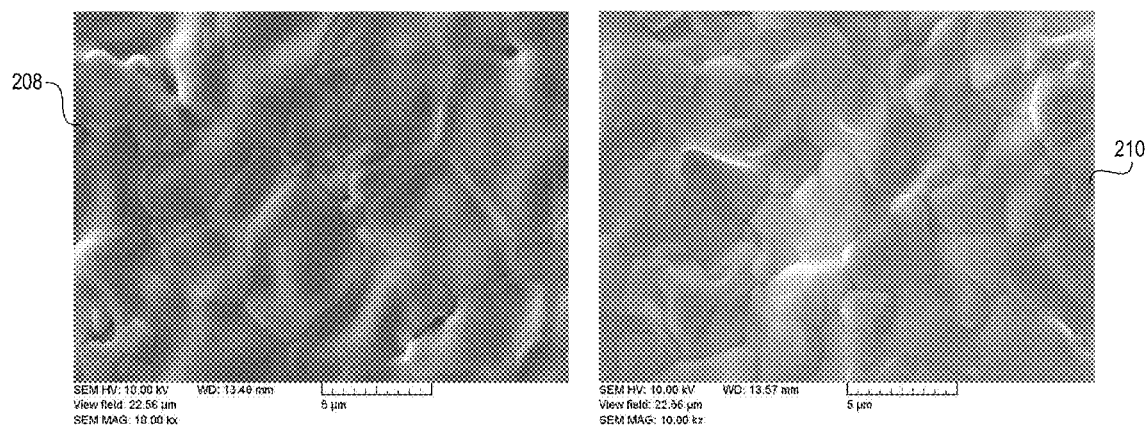

FIG. 2A shows micrographs 202-210 of a ceramic article at a 10,000-fold magnification before the ceramic article is processed using a heat treatment, and after the ceramic article has been processed using heat treatments of various temperatures, in accordance with embodiments of the present invention. The ceramic article shown in micrographs 202-210 is a HPM ceramic composite having $Y_4Al_2O_9$ and $Y_2\text{-}xZr_xO_3$ (a solution of $Y_2O_3$—$ZrO_2$). Micrograph 202 shows a sample of the ceramic article prior to heat treatment. Micrograph 204 shows the sample of micrograph 202 after a 1200° C. heat treatment. Micrograph 206 shows the sample of micrograph 202 after a 1500° C. heat treatment. Micrograph 208 shows the sample of micrograph 202 after a 1600° C. heat treatment. Micrograph 210 shows the sample of micrograph 202 after a 1700° C. heat treatment. As shown, the surface morphology of the HPM ceramic composite significantly changed above a 1500° C. heat treatment, causing surface roughness to significantly improve.

Figure 2B:
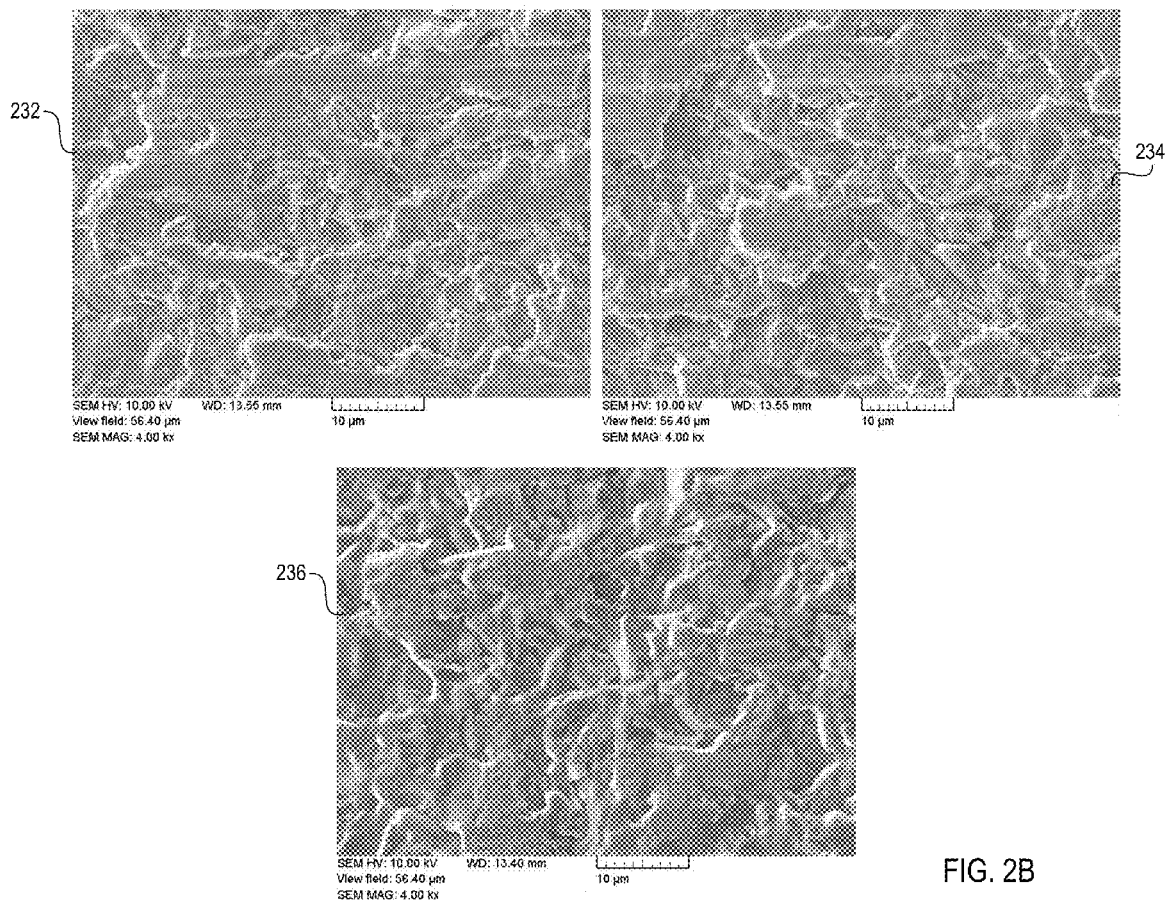
FIG. 2B shows micrographs of an HPM composite ceramic article at a 4,000-fold magnification before the ceramic article is processed using a heat treatment, and after the ceramic article has been processed using heat treatments of various temperatures, in accordance with embodiments of the present invention.
Figure 2B:
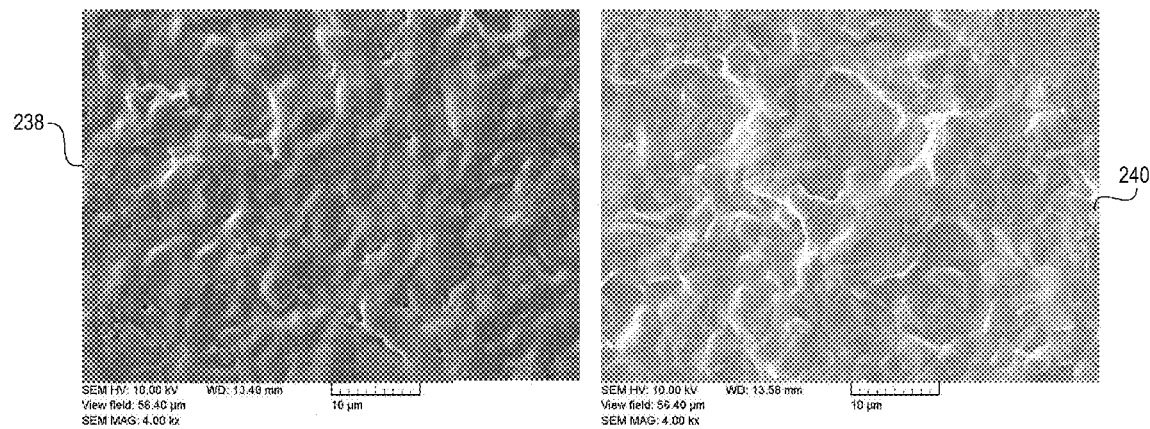

FIG. 2B shows micrographs 234-240 of an HPM composite ceramic article at a 4,000-fold magnification before the ceramic article is processed using a heat treatment, and after the ceramic article has been processed using heat treatments of various temperatures, in accordance with embodiments of the present invention. Micrograph 232 shows a sample of the ceramic article prior to heat treatment. Micrograph 234 shows the sample of micrograph 232 after heat treatment at 1200° C. Micrograph 236 shows the sample of micrograph 232 after heat treatment at 1500° C. Micrograph 238 shows the sample of micrograph 232 after heat treatment at 1600° C. Micrograph 240 shows the sample of micrograph 232 after heat treatment at 1700° C. As shown, the heat treatment caused surface roughness to significantly improve and surface morphology to change.

Figure 3A:
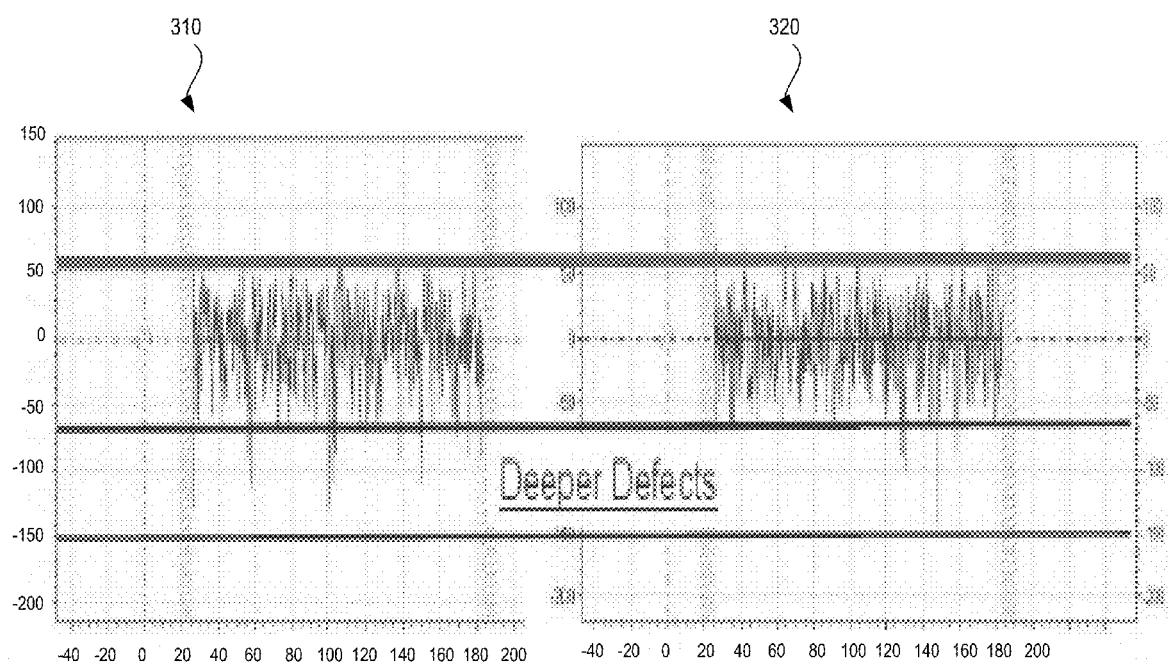
FIG. 3A illustrates surface profiles of the ceramic articles of FIGS. 2A-2B before and after the heat treatment, in accordance with one embodiment of the present invention.

FIG. 3A is a graph showing surface profiles of the ceramic articles before heat treatment 310 and after the heat treatment 320, in accordance with one embodiment of the present invention. The vertical axis represents the surface profile variation from a baseline (represented as 0) in micro-inches, and the horizontal axis represents distance across the surface of the ceramic article in thousandths of an inch. As shown, the number of defects that are deeper than about 70 micro-inches are significantly reduced from about 8 defects deeper than about 70 micro-inches over 160 thousandths micro-inch to about 3 defects deeper than about 70 micro-inches over 160 thousandths micro-inch. Accordingly, the defect density for deep defects (e.g., defects greater than about 70 micro-inches or greater than 1 standard deviation from average) may be reduced by 50% or more. Additionally, the uniformity and surface roughness of the surface is improved in the post-heat treated ceramic article. A surface roughness as low as about 0.1 μ-inch may be achieved in some embodiments. Post heat treatment, the ceramic article may have a surface roughness of about 0.1 μ-inch to about 150 μ-inch, depending on the type of ceramic, pre-heat treatment surface roughness, and so on. In one embodiment, post-heat treatment surface roughness is approximately 20-60 μ-inch.

Figure 3B:
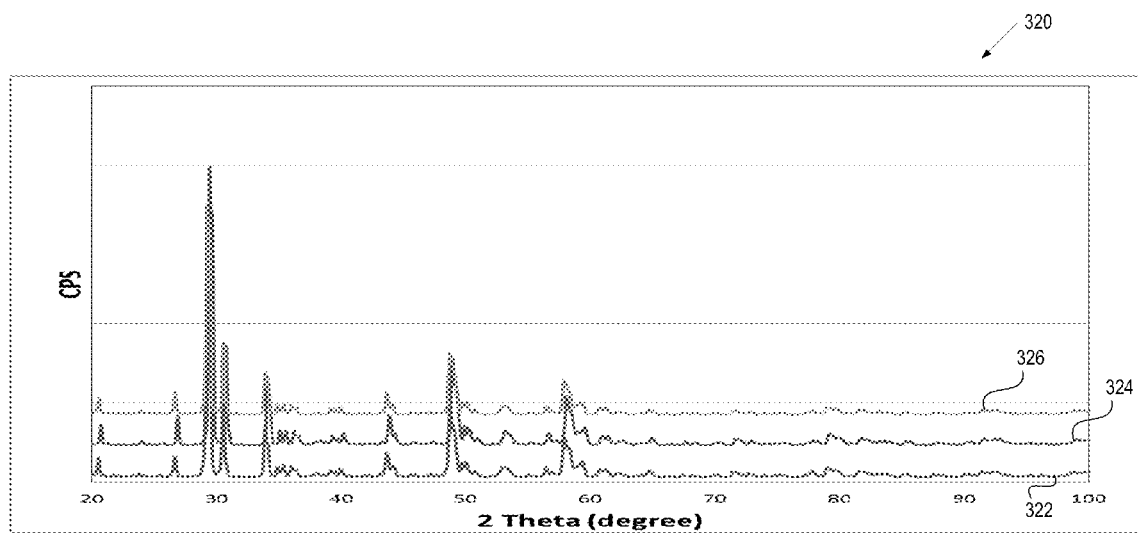
FIG. 3B illustrates a phase composition comparison of an HPM ceramic composite before heat treatment, after a 1200° C. heat treatment and after a 1680° C. heat treatment.

FIG. 3B is a graph 320 showing a phase composition comparison of an HPM ceramic composite before heat treatment 322, after a 1200° C. heat treatment 324 and after a 1680° C. heat treatment 326. As shown, the heat treatment may not change a phase composition of the HPM ceramic composite.

Figure 4A:
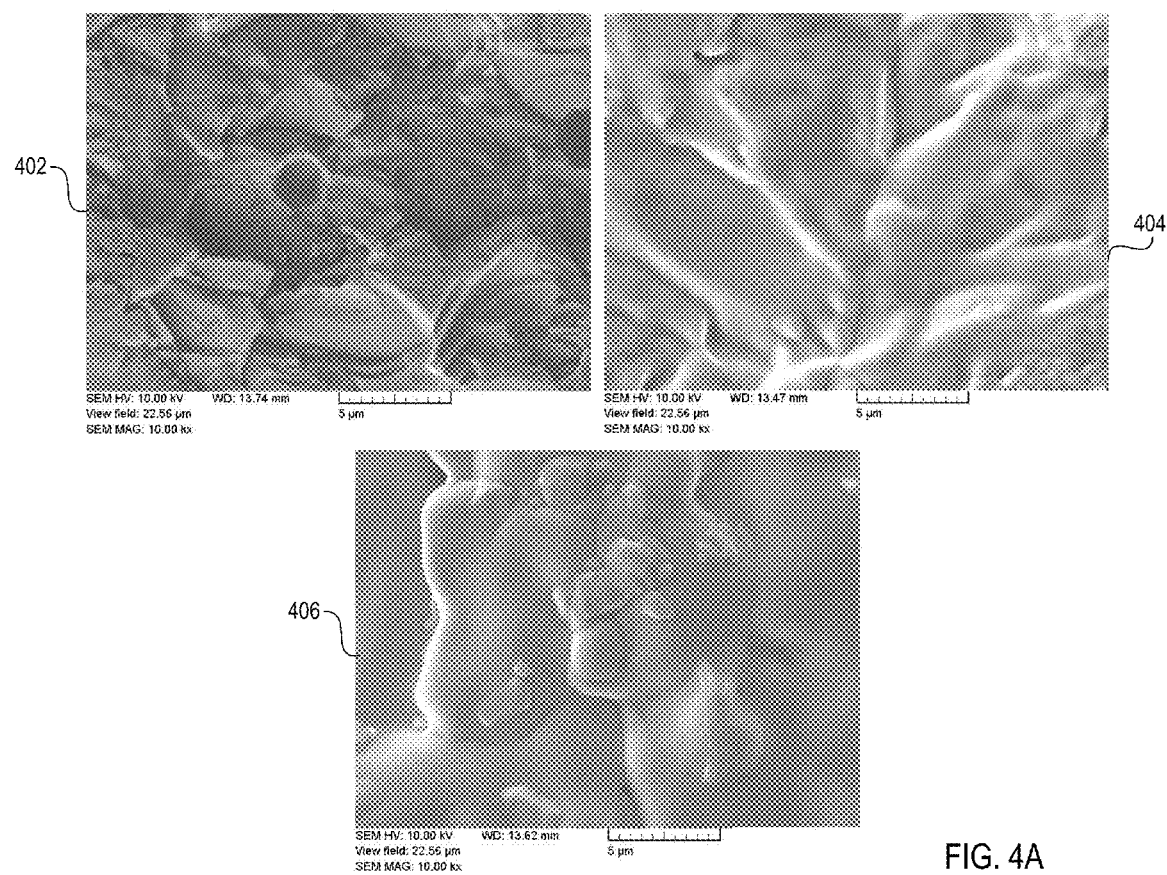
FIG. 4A shows micrographs of a solid yttria ceramic article at a 10,000-fold magnification before and after the solid yttria ceramic article is processed using a heat treatment, in accordance with one embodiment of the present invention.

FIG. 4A shows micrographs 402-406 of a solid yttria ceramic article at a 10,000-fold magnification before and after the solid yttria ceramic article is processed using a heat treatment, in accordance with one embodiment of the present invention. Micrograph 402 shows a sample of the ceramic article prior to heat treatment. Micrograph 404 shows the sample of micrograph 402 after heat treatment at 1500° C. Micrograph 406 shows the sample of micrograph 402 after heat treatment at 1700° C. As shown, the heat treatment caused surface morphology to change, significantly improving roughness and removing particles and potential particles.

Figure 4B:
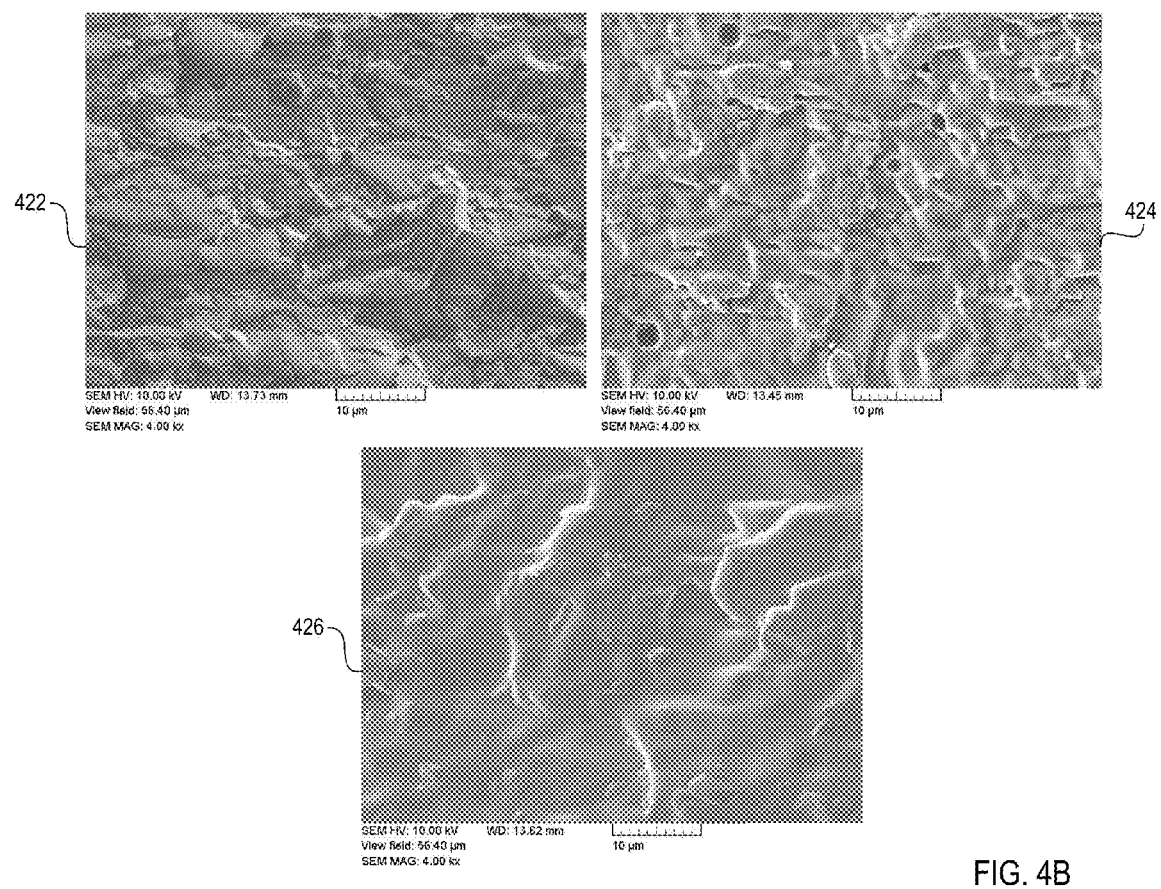
FIG. 4B shows micrographs of a solid yttrium oxide ceramic article at a 4,000-fold magnification before and after the solid yttrium oxide ceramic article is processed using the heat treatment, in accordance with one embodiment of the present invention.

FIG. 4B shows micrographs 422-426 of a solid yttria ceramic article at a 4,000-fold magnification before and after the solid yttria ceramic article is processed using the heat treatment, in accordance with one embodiment of the present invention. Micrograph 422 shows a sample of the ceramic article prior to heat treatment. Micrograph 424 shows the sample of micrograph 422 after heat treatment at 1500° C. Micrograph 426 shows the sample of micrograph 422 after heat treatment at 1700° C. As shown, the heat treatment caused surface roughness to significantly improve.

Figure 5:
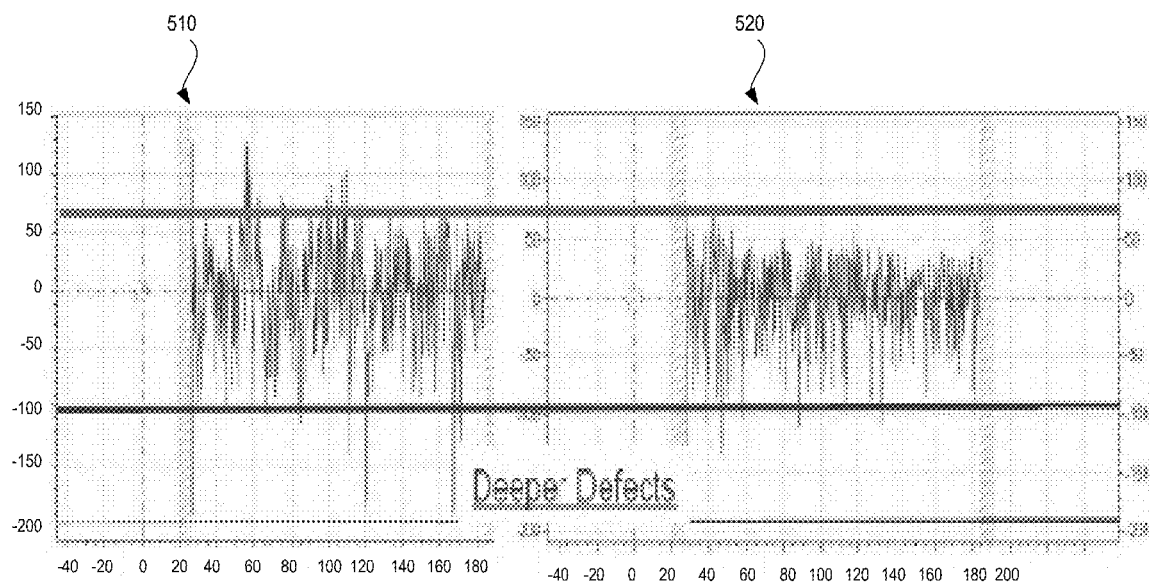
FIG. 5 illustrates surface profiles of the solid yttrium oxide ceramic article of FIGS. 4A-4B before and after the heat treatment, in accordance with one embodiment of the present invention.

FIG. 5 is a graph showing surface profiles of the solid yttria ceramic article of FIGS. 4A-4B before the heat treatment 510 and after the heat treatment 520, in accordance with one embodiment of the present invention. The vertical axis represents the profile variation in micro-inches, and the horizontal axis represents distance across the surface in thousandths of an inch. As shown, the number of defects that are deeper than about 100 micro-inches are significantly reduced, as is the depth of these defects. For example, prior to the heat treatment, there were at least two defects over 160 thousandths of an inch that were nearly 200 micro-inches deep. In contrast, there were no surface defects with those depths after the heat treatment. Additionally, the uniformity of the surface is improved in the post-heat treated ceramic article.

TABLE 1

Surface Morphology Pre-Heat Treatment and Post-Heat Treatment

|  |  | $R_a$ (μ-inch) | $R_z$ (μ-inch) | RHSC (unitless) | $P_{mr}$ (%) |
|---|---|---|---|---|---|
| HPM | Pre-Heat Treatment | 23.86 | 176.29 | 19 | 1.94 |
|  | Post-Heat Treatment | 20.46 | 156.83 | 29 | 2.16 |
| Y2O3 | Pre-Heat Treatment | 32.21 | 222.26 | 18 | 0.95 |
|  | Post-Heat Treatment | 26.26 | 198.65 | 29 | 1.88 |

Table 1 shows a surface morphology of HPM and yttria ceramic articles before and after performing a heat treatment on the ceramic articles, in accordance with embodiments of the present invention. The surface morphology shown in Table 1 is based on measurements of the HPM and yttria ceramic articles illustrated in FIGS. 2A-5.

The surface morphology may be represented using surface roughness parameters and/or surface uniformity parameters. Measured parameters that represent surface roughness are average roughness ($R_a$) and maximum peak to valley height ($R_z$). $R_a$ may be determined by computing an arithmetic average of the absolute values of roughness profile ordinates within a specified window. $R_z$ may be computed by finding and measuring the greatest peak to valley distance within the window. $R_a$ and $R_z$ have units of measurement in micro-inches (μ-inches) in Table 1. Lower values of $R_a$ and $R_z$ represent a smoother surface, and may be indicators of improved performance with regards to particle contamination. Measured parameters that represent surface uniformity are high spot count (RHSC) and bearing length ratio ($P_{mr}$). RHSC is computed by determining a cut height based on subtracting a depth value from a highest peak within the window, and then counting a number of peaks that exceed the cut height. $P_{mr}$ is computed by adding up peak widths of the peaks at the cut height, and computing a percentage of the window that is filled by the sum of the peak widths. The depth value used to determine the cut height for RHSC and $P_{mr}$ in Table 1 is 20 μ-inches. Higher values of RHSC and $P_{mr}$ represent greater uniformity, and may be indicators of improved performance with regards to particle contamination.

As shown, the $R_a$, $R_z$, RHSC and $P_{mr}$ values for both the HPM and yttria ceramic articles improved as a result of the heat treatment. In one embodiment, centerline average surface roughness ($R_a$) is improved by about 3-5 μ-inches or about 10-20% for HPM ceramic articles and by about 5-10 μ-inches or about 15-30% for yttria ceramic articles. As shown, post treatment surface roughness for HPM ceramic articles may be around 20 μ-inches and post heat treatment surface roughness for yttria ceramic articles may be around 26 μ-inches in one embodiment. Empirical evidence also shows that the amount of particle contamination caused during plasma etch processes by ceramic lids and ceramic nozzles is decreased as a result of the heat treatment.

Figure 6:
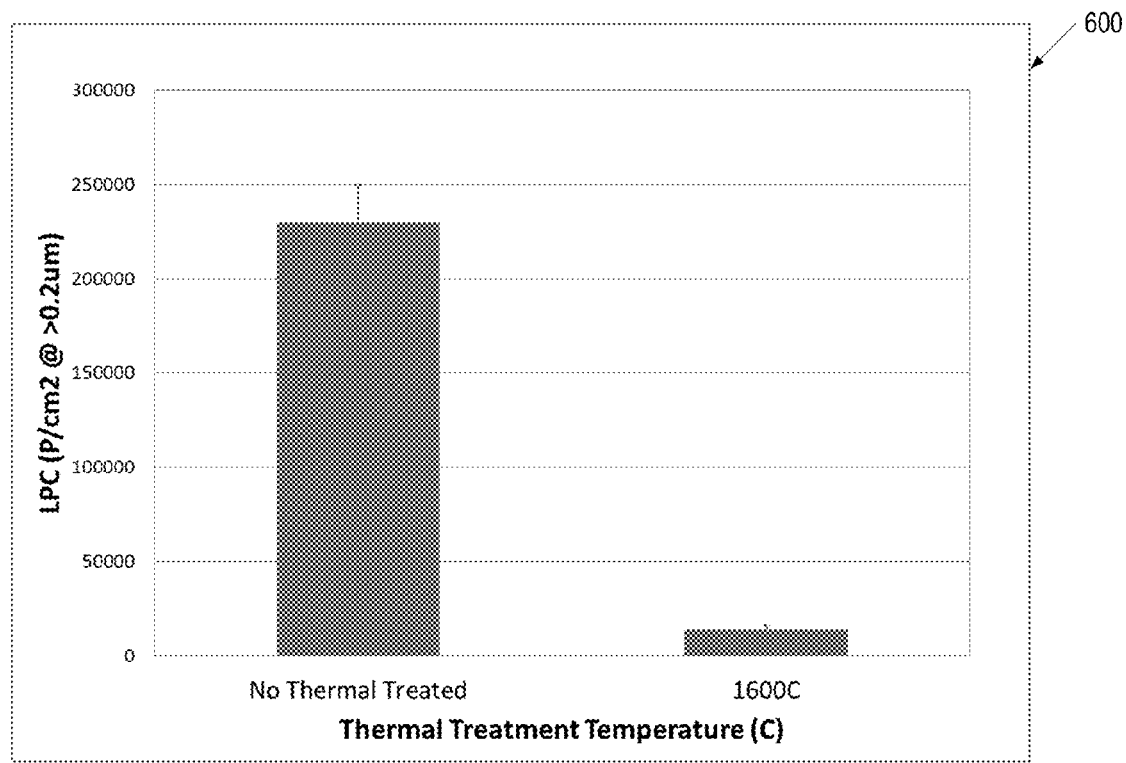
FIG. 6 illustrates surface particle count of an HPM composite ceramic before and after heat treatment, in accordance with one embodiment of the present invention.

FIG. 6 is a chart 600 showing surface particle count of an HPM composite ceramic before and after heat treatment, in accordance with one embodiment of the present invention. In chart 600, measured particles have a size greater than or equal to 0.2 microns. As shown, the particle count prior to heat treatment is in excess of 200,000 particles per square centimeter, with a range of about 210,000 particles to about 250,000 across samples (e.g., 230,000±20,000 particles per square centimeter). However, the particle count after a heat treatment at 1600° C. is about 15,000±1,000 particles per square centimeter. Accordingly, the surface particle count may be significantly improved by performing heat treatments described herein. In one embodiment, the surface particle count may improve by over 200,000 particles per square centimeter, which is in improvement of as much as about 93%.

Figure 7:
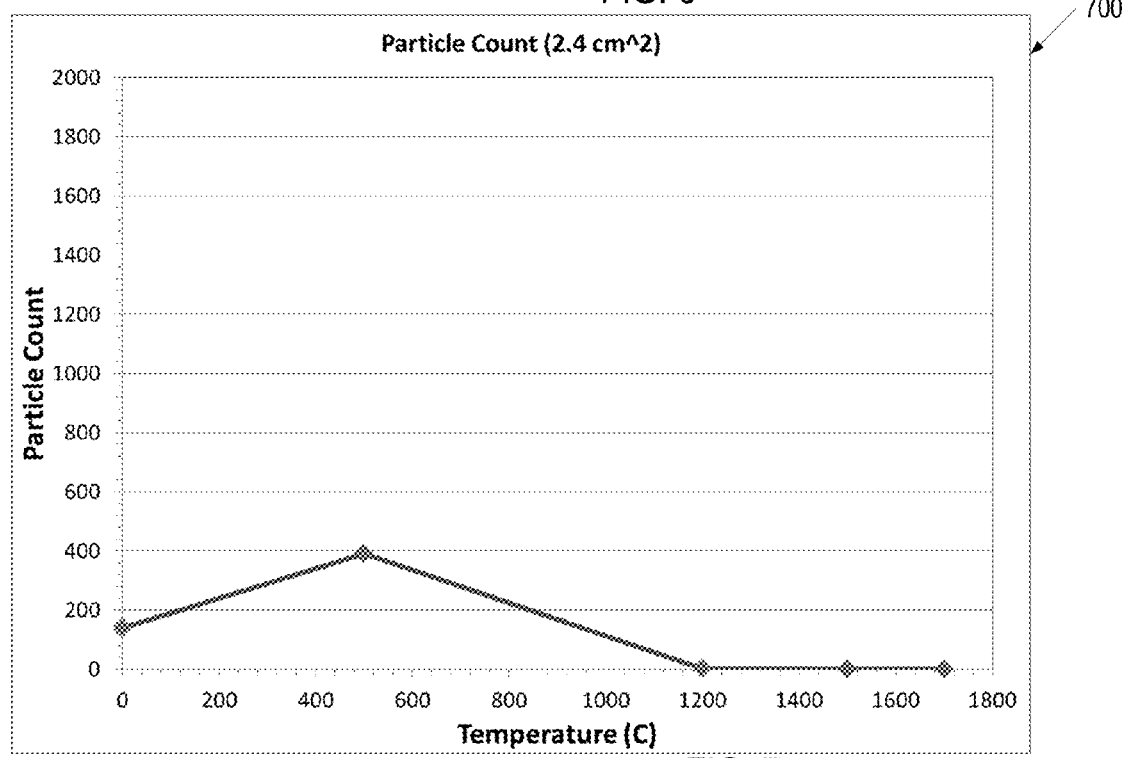
FIG. 7 illustrates surface particle count (in thousands of particles) of an HPM composite ceramic before heat treatment and during heat treatment at various temperatures, in accordance with embodiments of the present invention.

FIG. 7 is another chart 700 showing surface particle count (in thousands of particles) of an HPM composite ceramic before heat treatment and during heat treatment at various temperatures, in accordance with embodiments of the present invention. In chart 700, measured particles may have a size greater than or equal to 0.2 microns. As shown, the particle count prior to heat treatment is about 180,000 particles per square centimeter. The particle count increases in relation to temperature increases for heat treatments up to around 500° C. The particle count then decreases in relation to temperature increases for heat treatments of about 500° C. to about 1200° C.

Note that for heat treatments of up to about 1200° C., the interaction between particles and a surface of the ceramic article may be dominated by a van der Waals force, according to the following equation:

$$F = \frac{A}{12\pi H^2} \quad \text{(equation 1)}$$

where F is force, A is area and H is distance. As the heat treatment temperature increases from room temperature to about 500° C., the van der Wall force may weaken, and thermal expansion may induce an increase in the distance H. As the heat treatment temperature increases from 500° C. to about 1200° C., the van der Waal force may strengthen due at least in part to decreases in the distance H. Such reductions in distance may be due to the substrate surface absorbing particles and/or deformations.

At temperatures between about 1200° C. and 1800° C., a liquid film may be formed between particles and the substrate surface. Between about 1200° C. and 1500° C., the liquid film may be a thin liquid film, and between about 1500° C. and 1800° C., the liquid film may be a thick liquid film. At temperatures up to about 1800° C., the interaction between the particles and the substrate surface may be dominated by interaction through the liquid by a capillary force, according to the following equation:

$$F = 4\pi \gamma R \cos \theta \quad \text{(equation 2)}$$

where F is force, γ is liquid-air surface tension, R is effective radius of the interface between the particles and substrate surface, and θ is contact angle. At these temperatures, particles may be diffused into the liquid, and may be re-grown on a corresponding grain. This may cause particles to be removed from the substrate surface, even after the ceramic article has cooled.

For the HPM ceramic composite and yttria, 1800° C. is the sintering temperature. Accordingly, at temperatures at or above around 1800° C., a liquid phase is formed in the bulk of the substrate between powders. These powders may melt into liquid and grow into grains of increasing size. Atoms may be diffused from high energy grains to low energy grains until an equilibrium is reached. Accordingly, in one embodiment, the heat treatment is performed at temperatures below about 1800° C.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or."

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method comprising:
    heating a machined ceramic article to a temperature range between about 1000° C. and about 1800° C., the machined ceramic article having a surface with an initial surface defect density and an initial surface roughness, wherein the initial surface defect density is based on a plurality of surface defects, the plurality of surface defects comprising a plurality of broken bonds, and wherein the machined ceramic article comprises an uncoated bulk sintered ceramic comprising a rare earth oxide;
    heat treating the machined ceramic article at one or more temperatures within the temperature range for a duration of up to about 24 hours, the heat treating comprising:
        melting a layer of the machined ceramic article at the surface;
        diffusing surface particles into the melted layer; and
        re-growing the surface particles on grains of the machined ceramic article; and
    cooling the machined ceramic article, wherein after the heat treatment the machined ceramic article has a reduced surface defect density and a reduced surface roughness.

2. The method of claim 1, wherein the machined ceramic article consists essentially of at least one of $Y_2O_3$, $Al_2O_3$, $Y_4Al_2O_9$ (YAM), $YAlO_3$ (YAP), $Y_3Al_5O_{12}$ (YAG), $Y_3Al_5O_{12}$ (YAG) distributed $Al_2O_3$, Quartz, AlON, $TiO_2$, or $ZrO_2$.

3. The method of claim 1, wherein the machined ceramic article comprises a compound of $Y_4Al_2O_9$ (YAM) and a solid-solution of $Y_2O_3$—$ZrO_2$ ($Y_2$-$xZr_xO_3$).

4. The method of claim 1, further comprising:
    after the machined ceramic article has been used in a plasma etch process, repeating the heating, the heat treating and the cooling to reduce an increased surface defect density caused by the plasma etch process.

5. The method of claim 4, wherein the plasma etch process causes polymers to form on the ceramic article, and wherein repeating the heat treating in the presence of oxygen dry cleans the ceramic article by causing said polymers to react with the oxygen to become gases.

6. The method of claim 1, wherein the heat treating is performed in at least one of a vacuum or the presence of $N_2$.

7. The method of claim 1, wherein the machined ceramic article is one of a lid for a plasma etcher or a nozzle for a plasma etcher.

8. The method of claim 1, wherein the heat treating causes a surface roughness of the ceramic article to improve by approximately 10-30% and causes a surface particle count to improve by about 50-90%.

9. The method of claim 1, wherein the heating is performed at a ramping rate of about 0.1° C. per minute to about 20° C. per minute, and wherein the cooling is performed at the ramping rate.

10. The method of claim 1, wherein the machined ceramic article comprises $Y_2O_3$.

11. The method of claim 1, wherein the machined ceramic article comprises $Y_3Al_5O_{12}$ (YAG).

12. A method comprising:
receiving a machined and heat treated ceramic article comprising a bulk sintered rare earth oxide that has been used in a plasma etch process, wherein the machined and heat treated ceramic article has a surface defect density level caused by the plasma etch process;
heating the machined and heat treated ceramic article to a temperature range between about 1000° C. and about 1800° C.;
heat treating the machined and heat treated ceramic article at one or more temperatures within the temperature range for a duration of up to about 24 hours; and
cooling the machined and heat treated ceramic article, wherein after completing the heat treating the machined and heat treated ceramic article has a new surface defect density level below the surface defect density level caused by the plasma etch process.

13. The method of claim 12, wherein the plasma etch process causes polymers to form on the machined and heat treated ceramic article, and wherein performing the heat treating in the presence of oxygen dry cleans the machined and heat treated ceramic article by causing said polymers to react with the oxygen to become gases.

14. The method of claim 12, wherein the machined ceramic article consists essentially of at least one of $Y_2O_3$, $Al_2O_3$, $Y_4Al_2O_9$ (YAM), $YAlO_3$ (YAP), $Y_3Al_5O_{12}$ (YAG), $Y_3Al_5O_{12}$ (YAG) distributed $Al_2O_3$, Quartz, AlON, $TiO_2$, or $ZrO_2$.

15. The method of claim 12, wherein the machined ceramic article comprises a compound of $Y_4Al_2O_9$ (YAM) and a solid-solution of $Y_2O_3$—$ZrO_2$ ($Y_2$-$xZr_x(O_3)$).

16. A method comprising:
heating a machined ceramic article to a temperature range between about 1000° C. and about 1800° C., the machined ceramic article having an initial surface defect density and an initial surface roughness, wherein the machined ceramic article comprises an uncoated bulk sintered ceramic comprising a compound of $Y_4Al_2O_9$ (YAM) and a solid-solution of $Y_2O_3$—$ZrO_2$ ($Y_2$-$xZr_xO_3$);
heat treating the machined ceramic article at one or more temperatures within the temperature range for a duration of up to about 24 hours; and
cooling the machined ceramic article, wherein after the heat treatment the machined ceramic article has a reduced surface defect density and a reduced surface roughness.

17. The method of claim 16, wherein the heating is performed at a ramping rate of about 0.1° C. per minute to about 20° C. per minute, and wherein the cooling is performed at the ramping rate.

18. The method of claim 16, wherein the heat treating causes a surface roughness of the ceramic article to improve by approximately 10-30% and causes a surface particle count to improve by about 50-90%.

19. The method of claim 16, wherein the heat treating is performed in at least one of a vacuum or the presence of $N_2$.

20. The method of claim 16, wherein the machined ceramic article is one of a lid for a plasma etcher or a nozzle for a plasma etcher.

* * * * *